(12) United States Patent
Shaikh et al.

(10) Patent No.: US 9,520,295 B2
(45) Date of Patent: Dec. 13, 2016

(54) METAL DOPING OF AMORPHOUS CARBON AND SILICON FILMS USED AS HARDMASKS IN SUBSTRATE PROCESSING SYSTEMS

(71) Applicant: LAM RESEARCH CORPORATION, Fremont, CA (US)

(72) Inventors: Fayaz Shaikh, Portland, OR (US); Sirish Reddy, Hillsboro, OR (US); Alice Hollister, Tigard, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/612,750

(22) Filed: Feb. 3, 2015

(65) Prior Publication Data

US 2016/0225632 A1 Aug. 4, 2016

(51) Int. Cl.
*H01L 21/308* (2006.01)
*H01J 37/32* (2006.01)
*C23C 16/458* (2006.01)
*C23C 16/52* (2006.01)
*C23C 16/50* (2006.01)
*H01L 21/02* (2006.01)
*H01L 21/3065* (2006.01)

(52) U.S. Cl.
CPC ......... *H01L 21/3081* (2013.01); *C23C 16/458* (2013.01); *C23C 16/50* (2013.01); *C23C 16/52* (2013.01); *H01J 37/32082* (2013.01); *H01J 37/32449* (2013.01); *H01L 21/02115* (2013.01); *H01L 21/02274* (2013.01); *H01L 21/3065* (2013.01); *H01L 21/3085* (2013.01); *H01L 21/3086* (2013.01)

(58) Field of Classification Search
CPC ............... H01L 21/02115; H01L 21/02142; H01L 21/3081
See application file for complete search history.

(56) References Cited

U.S. PATENT DOCUMENTS

| | | |
|---|---|---|
| 6,939,808 B2 | 9/2005 | Tzou et al. |
| 7,084,071 B1 | 8/2006 | Dakshina-Murthy et al. |
| 7,718,081 B2 | 5/2010 | Liu et al. |
| 7,981,810 B1 | 7/2011 | Subramonium et al. |
| 2004/0259355 A1 | 12/2004 | Yin et al. |
| 2010/0184294 A1 | 7/2010 | Park et al. |

(Continued)

OTHER PUBLICATIONS

Article "Applied Materials Introduces New Hardmask Process, Saphira"; http://semimd.com/blog/2014/11/24/applied-materials-introduces-new-hardmask-process-saphira/; dated Nov. 24, 2014. pp. 1-5.

(Continued)

*Primary Examiner* — Daniel Shook

(57) ABSTRACT

Systems and methods for depositing a metal-doped amorphous carbon hardmask film or a metal-doped amorphous silicon hardmask film includes arranging a substrate in a processing chamber; supplying a carrier gas to the processing chamber; supplying a hydrocarbon precursor gas or a silicon precursor gas to the processing chamber, respectively; supplying a metal-based precursor gas to the processing chamber; one of creating or supplying plasma in the processing chamber; and depositing a metal-doped amorphous carbon hardmask film or a metal-doped amorphous silicon hardmask film on the substrate, respectively.

36 Claims, 2 Drawing Sheets

(56) References Cited

U.S. PATENT DOCUMENTS

| | | |
|---|---|---|
| 2012/0258261 A1 | 10/2012 | Reddy et al. |
| 2013/0316518 A1 | 11/2013 | Hollister et al. |
| 2014/0120723 A1 | 5/2014 | Fu et al. |
| 2014/0175617 A1 | 6/2014 | Antonelli et al. |
| 2014/0213059 A1 | 7/2014 | Doan et al. |
| 2016/0027614 A1* | 1/2016 | Manna ............... H01J 37/3244 216/49 |

OTHER PUBLICATIONS

Huajun Zheng, Chunan Ma, Jianguo Huang and Guohua Li; "Plasma Enhanced Chemical Vapor Deposition Nanocrystalline Tungsten Carbide Thin Film and Its Electro-catalytic Activity"; J. Mater. Sci. Technol. vol. 21, No. 4, Mar. 10, 2005, p. 545-548.

* cited by examiner

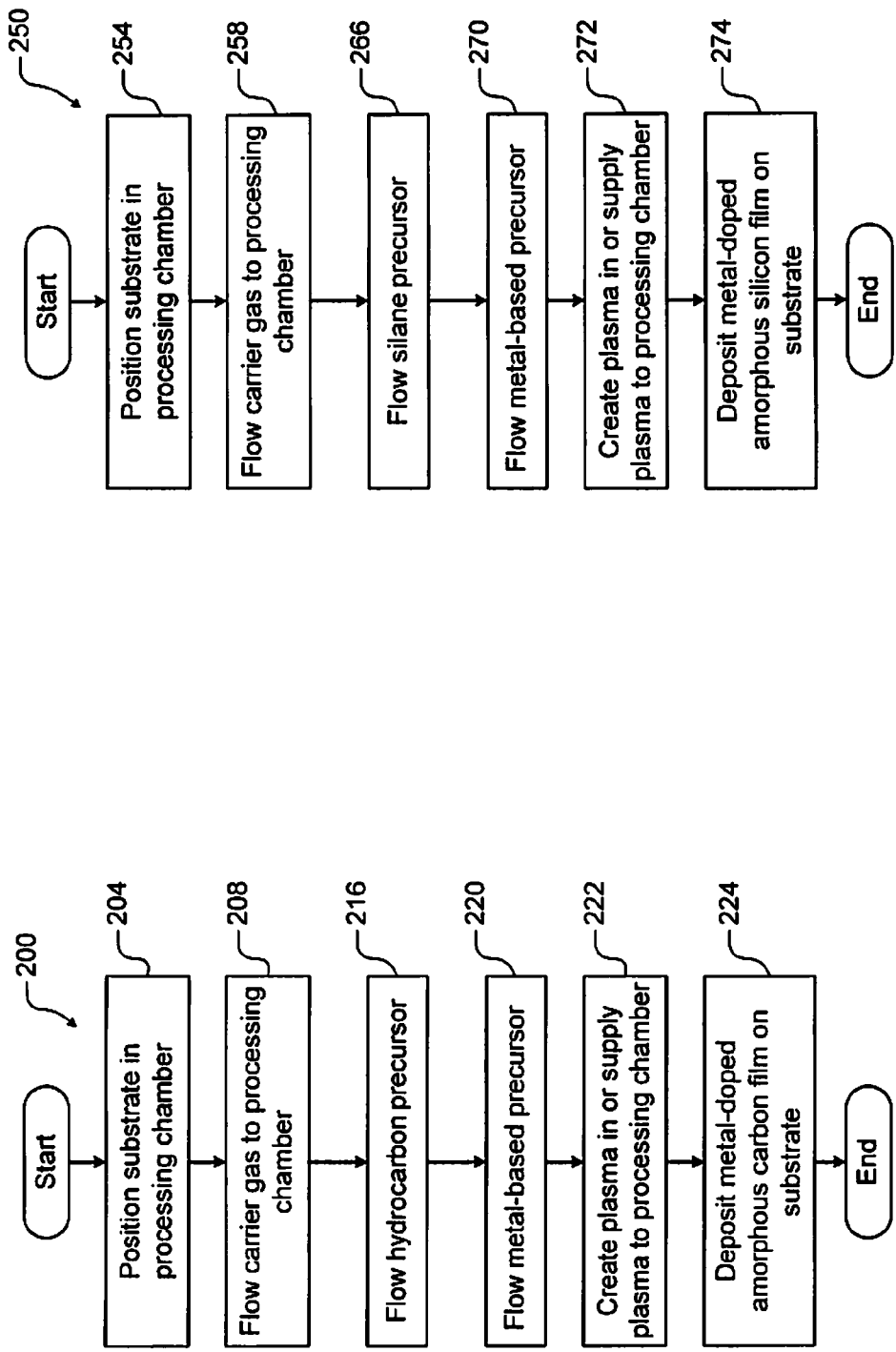

METAL DOPING OF AMORPHOUS CARBON AND SILICON FILMS USED AS HARDMASKS IN SUBSTRATE PROCESSING SYSTEMS

FIELD

The present disclosure relates to substrate processing systems and methods, and more particularly to systems and methods for depositing amorphous carbon and amorphous silicon hardmasks on substrates.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems for performing deposition and/or etching include a processing chamber with a pedestal. A substrate such as a semiconductor wafer may be arranged on the pedestal. For example in a chemical vapor deposition (CVD) process, a gas mixture including one or more precursors may be introduced into the processing chamber to deposit film on the substrate or to etch the substrate. In some substrate processing systems, plasma may be used to activate chemical reactions and is referred to herein as plasma enhanced CVD (PECVD).

Amorphous carbon and silicon films may be used as hardmasks for etching high aspect ratio features during substrate processing. For example in 3D memory applications, the hardmask film should be highly etch selective. As a result, the hardmask film should have higher modulus, denser, and more etch-chemistry-resistive bonding matrices. A balance is struck between being able to remove the hardmask film during an opening process and having the hardmask film be highly selective to the dielectric etching processes.

SUMMARY

A method for depositing a metal-doped amorphous carbon hardmask film includes arranging a substrate in a processing chamber; supplying a carrier gas to the processing chamber; supplying a hydrocarbon precursor gas to the processing chamber; supplying a metal-based precursor gas to the processing chamber; one of creating or supplying plasma in the processing chamber; and depositing a metal-doped amorphous carbon hardmask film on the substrate.

In other features, the processing chamber comprises a plasma enhanced chemical vapor deposition (PECVD) processing chamber. The metal-based precursor gas comprises a metal halide precursor gas. The metal halide precursor gas is selected from a group consisting of $WF_a$, $TiCl_b$, $WCl_c$, $HfCl_d$, and $TaCl_e$, where a, b, c, d and e are integers greater than or equal to one. The metal-based precursor gas comprises tetrakis(dimethylamino)titanium (TDMAT) precursor gas. The metal-based precursor gas comprises bis(tert-butylimido)-bis-(dimethylamido)tungsten (BTBMW) precursor gas. The carrier gas comprises is selected from a group consisting of molecular hydrogen (H2), argon (Ar), molecular nitrogen (N2), helium (He), and/or combinations thereof. The hydrocarbon precursor gas comprises $C_xH_y$, wherein x is an integer from 2 to 10 and y is an integer from 2 to 24. The hydrocarbon precursor gas is selected from a group consisting of methane, acetylene, ethylene, propylene, butane, cyclohexane, benzene and toluene. The metal-based precursor gas comprises tungsten hexafluoride, the hydrocarbon precursor gas comprises methane and the carrier gas comprises molecular hydrogen.

A method for depositing a metal-doped amorphous silicon hardmask film includes arranging a substrate in a processing chamber; supplying a carrier gas to the processing chamber; supplying a silicon precursor gas to the processing chamber; supplying a metal-based precursor gas to the processing chamber; one of creating or supplying plasma in the processing chamber; and depositing a metal-doped amorphous silicon hardmask film on the substrate.

In other features, the processing chamber comprises a plasma enhanced chemical vapor deposition (PECVD) processing chamber. The metal-based precursor gas comprises a metal halide precursor gas. The metal halide precursor gas is selected from a group consisting of $WF_a$, $TiCl_b$, $WCl_c$, $HfCl_d$, and $TaCl_e$, where a, b, c, d and e are integers greater than or equal to one. The metal-based precursor gas comprises tetrakis(dimethylamino)titanium (TDMAT) precursor gas. The metal-based precursor gas comprises bis(tert-butylimido)-bis-(dimethylamido)tungsten (BTBMW) precursor gas. The carrier gas is selected from a group consisting of molecular hydrogen ($H_2$), argon (Ar), molecular nitrogen ($N_2$), helium (He), and/or combinations thereof. The silicon precursor gas is selected from a group consisting of silane and tetraethylorthosilicate.

A substrate processing system for depositing a metal-doped amorphous carbon hardmask film includes a processing chamber including a substrate support configured to support a substrate. A gas supply system is configured to selectively supply process gas to the processing chamber. A plasma generator is configured to selectively supply plasma in the processing chamber. A controller is configured to control the gas supply system and the plasma generator and configured to: supply a carrier gas to the processing chamber; supply a hydrocarbon precursor gas to the processing chamber; supply a metal-based precursor gas to the processing chamber; supply plasma in the processing chamber; and deposit a metal-doped amorphous carbon hardmask film on the substrate.

In other features, the processing chamber comprises a plasma enhanced chemical vapor deposition (PECVD) processing chamber. The metal-based precursor gas comprises a metal halide precursor gas. The metal halide precursor gas is selected from a group consisting of $WF_a$, $TiCl_b$, $WCl_c$, $HfCl_d$, and $TaCl_e$, where a, b, c, d and e are integers greater than or equal to one. The metal-based precursor gas comprises tetrakis(dimethylamino)titanium (TDMAT) precursor gas. The metal-based precursor gas comprises bis(tert-butylimido)-bis-(dimethylamido)tungsten (BTBMW) precursor gas. The carrier gas is selected from a group consisting of molecular hydrogen ($H_2$), argon (Ar), molecular nitrogen ($N_2$), helium (He), and/or combinations thereof. The hydrocarbon precursor gas comprises $C_xH_y$, wherein x is an integer from 2 to 10 and y is an integer from 2 to 24. The hydrocarbon precursor gas is selected from a group consisting of methane, acetylene, ethylene, propylene, butane, cyclohexane, benzene and toluene. The metal-based precursor gas comprises tungsten hexafluoride, the hydrocarbon precursor gas comprises methane and the carrier gas comprises molecular hydrogen.

A substrate processing system for depositing a metal-doped amorphous silicon hardmask film includes a processing chamber including a substrate support configured to support a substrate; a gas supply system configured to selectively supply process gas to the processing chamber; a plasma generator configured to selectively supply plasma in the processing chamber; a controller configured to control the gas supply system and the plasma generator and configured to: supply a carrier gas to the processing chamber; supply a silicon precursor gas to the processing chamber; supply a metal-based precursor gas to the processing chamber; supply plasma in the processing chamber; and deposit a metal-doped amorphous silicon hardmask film on the substrate.

In other features, the processing chamber comprises a plasma enhanced chemical vapor deposition (PECVD) processing chamber. The metal-based precursor gas comprises a metal halide precursor gas. The metal halide precursor gas is selected from a group consisting of $WF_a$, $TiCl_b$, $WCl_c$, $HfCl_d$, and $TaCl_e$, where a, b, c, d and e are integers greater than or equal to one. The metal-based precursor gas comprises tetrakis(dimethylamino)titanium (TDMAT) precursor gas. The metal-based precursor gas comprises bis(tert-butylimido)-bis-(dimethylamido)tungsten (BTBMW) precursor gas. The carrier gas is selected from a group consisting of molecular hydrogen ($H_2$), argon (Ar), molecular nitrogen ($N_2$), helium (He), and/or combinations thereof. The silicon precursor gas is selected from a group consisting of silane and tetraethylorthosilicate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2 is a flowchart illustrating an example of a method for depositing a metal-doped amorphous carbon hardmask according to the present disclosure; and FIG. 3 is a flowchart illustrating an example of a method for depositing a metal-doped amorphous silicon hardmask according to the present disclosure.

In the drawings, reference numbers may be reused to identify similar and/or identical elements.

DETAILED DESCRIPTION

Figure 1:
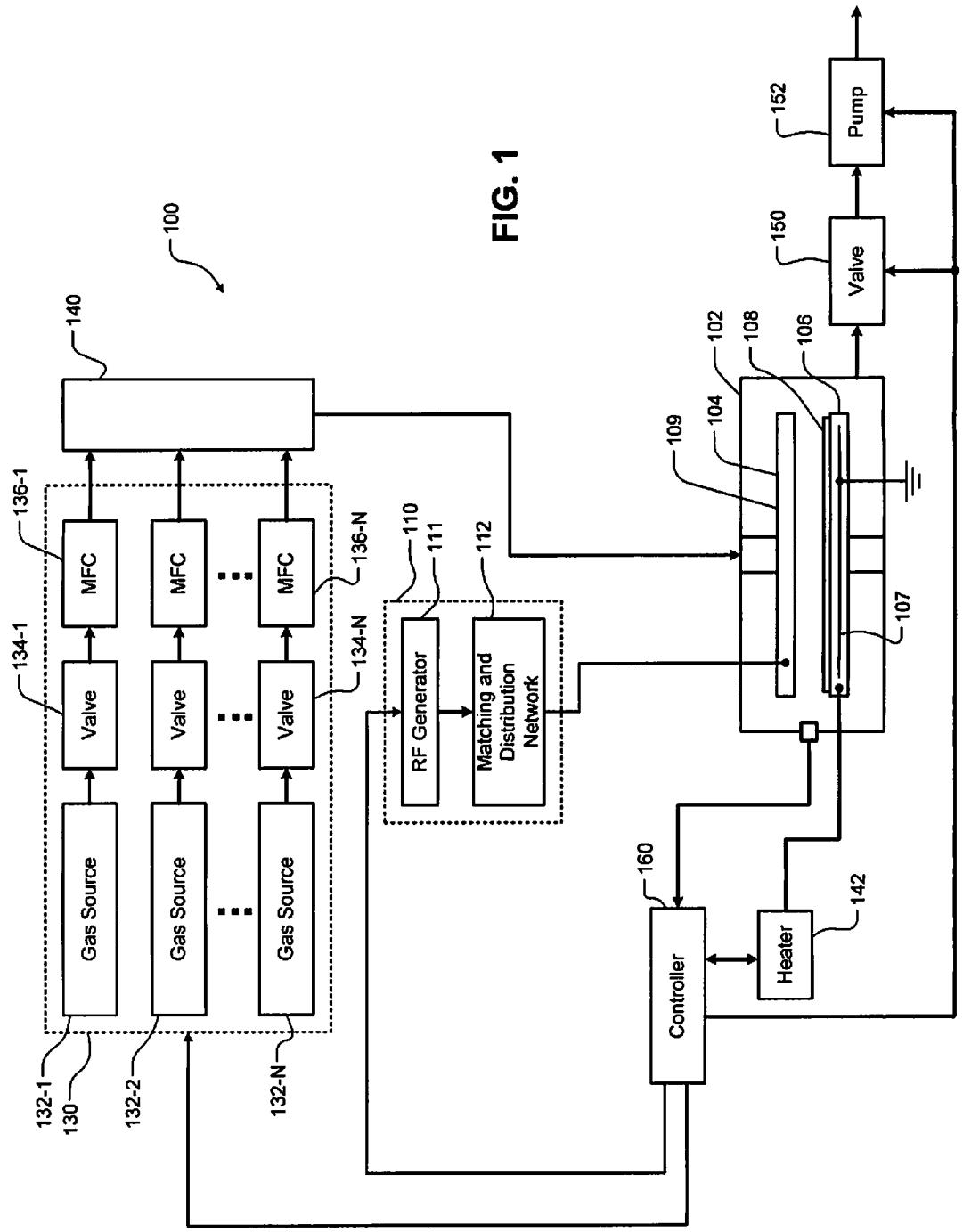
FIG. 1 is a functional block diagram illustrating an example of a substrate processing chamber for depositing a metal-doped amorphous carbon or silicon hardmask according to the present disclosure.

Amorphous carbon and silicon films are used as hardmasks for etching high aspect ratio features. In some applications such as 3-D memory, the hardmask film needs to be highly etch selective. As a result, the hardmask film should be hard, dense, and provide a balance of ease of removal and etch selectivity. Systems and methods described herein may be used to densify amorphous carbon or silicon hardmask films to increase etch selectivity to dielectric etch chemistries.

The systems and methods described herein dope amorphous carbon or silicon hardmask film with metal-based dopants. For example only, the metal-based dopants may be provided by metal halide precursors. In some examples, the metal halide precursors may include tungsten fluorides ($WF_a$), titanium chlorides ($TiCl_b$), tungsten chlorides ($WCl_c$), hafnium chlorides ($HfCl_d$), tantalum chlorides ($TaCl_e$), or other suitable metal halide precursors, where a, b, c, d and e are integers greater than zero. While the preceding metal halide precursor examples include fluorine and chlorine, other metal halide precursors including bromine (Br) or iodine (I) may be used. In other examples, the metal-based dopants may be provided by tetrakis(dimethylamino)titanium (TDMAT) precursor, bis(tert-butylimido)-bis-(dimethylamido)tungsten (BTBMW) precursor or other suitable metal precursors.

In some examples, amorphous carbon or silicon precursor is added to a carrier gas in the processing chamber. For example, the amorphous carbon precursor can include a hydrocarbon precursor. The hydrocarbon precursor may include $C_xH_y$, wherein x is an integer from 2 to 10 and y is an integer from 2 to 24. In some examples, the hydrocarbon precursor may include methane, acetylene, ethylene, propylene, butane, cyclohexane, benzene or toluene ($CH_4$, $C_2H_2$, $C_2H_4$, $C_3H_6$, $C_4H_{10}$, $C_6H_6$, $C_6H_{12}$ and $C_7H_8$, respectively). For example only, the amorphous silicon precursor may include silane or tetraethylorthosilicate (TEOS)-like precursors. In some examples, the carrier gas may include molecular hydrogen ($H_2$), argon (Ar), molecular nitrogen ($N_2$), helium (He), and/or combinations thereof. The PECVD process described herein deposits a metal-doped amorphous carbon or silicon film, which is more dense and etch selective.

The amorphous carbon or silicon hardmask film that is doped using metal-based precursors described herein creates a hardmask film including metal carbide or metal silicide, respectively, due to higher cross-linking. Higher doping levels increase selectivity but tend to increase the cost of subsequent steps. Therefore doping level and selectivity are balanced. The resulting metal-doped amorphous carbon or silicon hardmask film is harder and denser while remaining removable for semiconductor hardmask applications.

Referring now to FIG. 1, an example of a substrate processing system 100 for performing PECVD deposition or etching is shown. While the foregoing example relates to PECVD systems, other plasma-based substrate processes may be used. Other types of plasma processes include atomic layer deposition, inductively coupled plasma, capacitively coupled plasma, microwave plasma CVD, remote plasma enhanced CVD, and other similar processes.

The substrate processing system 100 includes a processing chamber 102 that encloses other components of the substrate processing system 100 and contains the RF plasma. The substrate processing system 100 includes an upper electrode 104 and a pedestal 106 including a lower electrode 107. A substrate 108 is arranged on the pedestal 106 between the upper electrode 104 and the lower electrode 107.

For example only, the upper electrode 104 may include a showerhead 109 that introduces and distributes process gases. Alternately, the upper electrode 104 may include a conducting plate and the process gases may be introduced in another manner. The lower electrode 107 may be arranged in a non-conductive pedestal. Alternately, the pedestal 106 may include an electrostatic chuck that includes a conductive plate that acts as the lower electrode 107.

An RF generating system 110 generates and outputs an RF voltage to one of the upper electrode and the lower electrode. The other one of the upper electrode and the lower electrode may be DC grounded, AC grounded or floating. For example only, the RF generating system 110 may include an RF voltage generator 111 that generates the RF voltage that is fed by a matching and distribution network 112 to the upper electrode 104 or the lower electrode 107.

An example of a gas delivery system 130 is shown in FIG. 1. A gas delivery system 130 includes one or more gas sources 132-1, 132-2, ..., and 132-N (collectively gas sources 132), where N is an integer greater than zero. The gas sources supply one or more precursors and mixtures thereof. Vaporized precursor may also be used. The gas sources 132 are connected by valves 134-1, 134-2, ..., and 134-N (collectively valves 134) and mass flow controllers 136-1, 136-2, ..., and 136-N (collectively mass flow controllers 136) to a manifold 140. An output of the manifold 140 is fed to the processing chamber 102. For example only, the output of the manifold 140 is fed to the showerhead 109.

A heater 142 may be connected to a heater coil (not shown) arranged in the pedestal 106 to heat the pedestal 106. The heater 142 may be used to control a temperature of the pedestal 106 and the substrate 108. A valve 150 and pump 152 may be used to evacuate reactants from the processing chamber 102. A controller 160 may be used to control various components of the substrate processing system 100. For example only, the controller 160 may be used to control flow of process, carrier and precursor gases, striking and extinguishing plasma, removal of reactants, monitoring of chamber parameters, etc.

Referring now to FIG. 2, a method 200 for depositing a metal-doped amorphous carbon hardmask film according to the present disclosure is shown. At 204, a substrate is positioned in a processing chamber such as a PECVD processing chamber. At 208, carrier gas is supplied to the processing chamber. In some examples, the carrier gas may include molecular hydrogen ($H_2$), argon (Ar), molecular nitrogen ($N_2$), helium (He), and/or combinations thereof.

At 216, a hydrocarbon precursor is supplied to the processing chamber. In some examples, the hydrocarbon precursor may include $C_xH_y$, wherein x is an integer from 2 to 10 and y is an integer from 2 to 24. In some examples, the hydrocarbon precursor may include methane, acetylene, ethylene, propylene, butane, cyclohexane, benzene or toluene.

At 220, a metal-based precursor or dopant is supplied to the processing chamber. In some examples, the metal-based precursor includes a metal halide precursor such as $WF_a$, $TiCl_b$, $WCl_c$, $HfCl_d$, $TaCl_e$, or other suitable metal halide precursors, where a, b, c, d and e are integers greater than zero. While the preceding metal halide precursor examples include fluorine and chlorine, other metal halide precursors including bromine (Br) or iodine (I) may be used. In other examples, the metal-based precursor may be provided by tetrakis(dimethylamino)titanium (TDMAT) precursor, bis (tert-butylimido)-bis-(dimethylamido)tungsten (BTBMW) precursor or other suitable metal precursors.

At 222, plasma is created in or supplied to the processing chamber. At 224, a metal-doped amorphous carbon hardmask film is deposited on the substrate. The metal-doped amorphous carbon hardmask film may be used as a hardmask during substrate processing.

Referring now to FIG. 3, a method 250 for depositing a metal-doped amorphous silicon film according to the present disclosure is shown. At 254, a substrate is positioned in a processing chamber such as a PECVD processing chamber. At 258, carrier gas is supplied to the processing chamber. In some examples, the carrier gas may include molecular hydrogen ($H_2$), argon (Ar), molecular nitrogen ($N_2$), helium (He), and/or combinations thereof.

At 266, a silicon precursor is supplied to the processing chamber. For example only, the amorphous silicon precursor may include silane or tetraethylorthosilicate (TEOS)-like precursors.

At 270, a metal-based precursor or dopant is supplied to the processing chamber. In some examples, the metal-based precursor includes a metal halide precursor such as $WF_a$, $TiCl_b$, $WCl_c$, $HfCl_d$, $TaCl_e$, or other suitable metal halide precursors, where a, b, c, d and e are integers greater than zero. While the preceding metal halide precursor examples include fluorine and chlorine, other metal halide precursors including bromine (Br) or iodine (I) may be used. In other examples, the metal-based precursor may be provided by tetrakis(dimethylamino)titanium (TDMAT) precursor, bis (tert-butylimido)-bis-(dimethylamido)tungsten (BTBMW) precursor or other suitable metal precursors.

At 272, plasma is created in or supplied to the processing chamber. At 274, a metal-doped amorphous silicon hardmask film is deposited on the substrate. The metal-doped amorphous silicon hardmask film may be used as a hardmask during substrate processing.

The following table sets forth an example of hydrocarbon precursor gas, carrier gas, metal-based precursor and other process parameters for a metal-doped amorphous carbon hardmask film according to the present disclosure:

| Process Parameter | Value |
| --- | --- |
| Temperature | 400° C.-500° C. |
| Pressure | 0.2 Torr to 9 Torr |
| $WF_6$ | 250 sccm |
| $CH_4$ | 2000 sccm |
| $H_2$ | 500 sccm |
| High Frequency Power | 800 W to 2500 W |
| Low Frequency Power | 1000 W to 2500 W |

In this example, the processing chamber temperature is in a temperature range from 400° C.-500° C. The processing chamber vacuum pressure is in a range from 0.2 Torr to 9 Torr. The high frequency RF power is set in a range from 800 W to 2500 W. The low frequency RF power is set in a range from 1000 W to 2500 W. The carrier gas is molecular hydrogen, the metal-based precursor gas is tungsten hexafluoride, and the carbon precursor is methane. Other precursors may use similar or different process chamber settings.

In other examples, the process temperature may be up to 650° C. In other examples, $WF_a$ is supplied at 6 to 75 sccm, $CH_4$ is supplied at 750 sccm, Ar and $N_2$ are supplied at 5000 sccm with process pressure between 2 Torr to 7 Torr and process temperature between 400° C. and 500° C.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for depositing a metal-doped amorphous carbon hardmask film, comprising:
   arranging a substrate on a pedestal in a processing chamber;
   supplying a carrier gas to the processing chamber;
   supplying a hydrocarbon precursor gas to the processing chamber;
   supplying a metal-based precursor gas to the processing chamber;
   providing, to the pedestal, first RF power at a first frequency;
   providing, to the pedestal, second RF power at a second frequency less than the first frequency;
   one of creating plasma in or supplying plasma to the processing chamber; and
   depositing a metal-doped amorphous carbon hardmask film on the substrate, wherein the carbon hardmask film includes metal carbide.

2. The method of claim 1, wherein the processing chamber comprises a plasma enhanced chemical vapor deposition (PECVD) processing chamber.

3. The method of claim 1, wherein the metal-based precursor gas comprises a metal halide precursor gas.

4. The method of claim 3 wherein the metal halide precursor gas is selected from a group consisting of $WF_a$, $TiCl_b$, $WCl_c$, $HfCl_d$, and $TaCl_e$, where a, b, c, d and e are integers greater than or equal to one.

5. The method of claim 1, wherein the metal-based precursor gas comprises tetrakis(dimethylamino)titanium (TDMAT) precursor gas.

6. The method of claim 1, wherein the metal-based precursor gas comprises bis(tert-butylimido)-bis-(dimethylamido)tungsten (BTBMW) precursor gas.

7. The method of claim 1, wherein the carrier gas is selected from a group consisting of molecular hydrogen ($H_2$), argon (Ar), molecular nitrogen ($N_2$), helium (He), and/or combinations thereof.

8. The method of claim 1, wherein the hydrocarbon precursor gas comprises $C_xH_y$, wherein x is an integer from 2 to 10 and y is an integer from 2 to 24.

9. The method of claim 1, wherein the hydrocarbon precursor gas is selected from a group consisting of methane, acetylene, ethylene, propylene, butane, cyclohexane, benzene and toluene.

10. The method of claim 1, wherein the metal-based precursor gas comprises tungsten hexafluoride, the hydrocarbon precursor gas comprises methane and the carrier gas comprises molecular hydrogen.

11. A method for depositing a metal-doped amorphous silicon hardmask film, comprising:
    arranging a substrate in a processing chamber;
    supplying a carrier gas to the processing chamber;
    supplying a silicon precursor gas to the processing chamber;
    supplying a metal-based precursor gas to the processing chamber;
    one of creating plasma in or supplying plasma to the processing chamber; and
    depositing a metal-doped amorphous silicon hardmask film on the substrate.

12. The method of claim 11, wherein the processing chamber comprises a plasma enhanced chemical vapor deposition (PECVD) processing chamber.

13. The method of claim 11, wherein the metal-based precursor gas comprises a metal halide precursor gas.

14. The method of claim 13, wherein the metal halide precursor gas is selected from a group consisting of $WF_a$, $TiCl_b$, $WCl_c$, $HfCl_d$, and $TaCl_e$, where a, b, c, d and e are integers greater than or equal to one.

15. The method of claim 11, wherein the metal-based precursor gas comprises tetrakis(dimethylamino)titanium (TDMAT) precursor gas.

16. The method of claim 11, wherein the metal-based precursor gas comprises bis(tert-butylimido)-bis-(dimethylamido)tungsten (BTBMW) precursor gas.

17. The method of claim 11, wherein the carrier gas is selected from a group consisting of molecular hydrogen ($H_2$), argon (Ar), molecular nitrogen ($N_2$), helium (He), and/or combinations thereof.

18. The method of claim 11, wherein the silicon precursor gas is selected from a group consisting of silane and tetraethylorthosilicate.

19. A substrate processing system for depositing a metal-doped amorphous carbon hardmask film, comprising:
    a processing chamber including a substrate support configured to support a substrate;
    a gas supply system configured to selectively supply process gas to the processing chamber;
    a plasma generator configured to selectively create plasma in or supply plasma to the processing chamber;
    a controller configured to control the gas supply system and the plasma generator and configured to:
    supply a carrier gas to the processing chamber;
    supply a hydrocarbon precursor gas to the processing chamber;
    supply a metal-based precursor gas to the processing chamber;
    provide, to the substrate support, first RF power at a first frequency;
    provide, to the substrate support, second RF power at a second frequency less than the first frequency;
    control the plasma generator to create plasma in or supply plasma to the processing chamber; and
    deposit a metal-doped amorphous carbon hardmask film on the substrate, wherein the carbon hardmask film includes metal carbide.

20. The substrate processing system of claim 19, wherein the processing chamber comprises a plasma enhanced chemical vapor deposition (PECVD) processing chamber.

21. The substrate processing system of claim 19, wherein the metal-based precursor gas comprises a metal halide precursor gas.

22. The substrate processing system of claim 21, wherein the metal halide precursor gas is selected from a group consisting of $WF_a$, $TiCl_b$, $WCl_c$, $HfCl_d$, and $TaCl_e$, where a, b, c, d and e are integers greater than or equal to one.

23. The substrate processing system of claim 19, wherein the metal-based precursor gas comprises tetrakis(dimethylamino)titanium (TDMAT) precursor gas.

24. The substrate processing system of claim 19, wherein the metal-based precursor gas comprises bis(tert-butylimido)-bis-(dimethylamido)tungsten (BTBMW) precursor gas.

25. The substrate processing system of claim 19, wherein the carrier gas is selected from a group consisting of molecular hydrogen ($H_2$), argon (Ar), molecular nitrogen ($N_2$), helium (He), and/or combinations thereof.

26. The substrate processing system of claim 19, wherein the hydrocarbon precursor gas comprises $C_xH_y$, wherein x is an integer from 2 to 10 and y is an integer from 2 to 24.

27. The substrate processing system of claim 19, wherein the hydrocarbon precursor gas is selected from a group consisting of methane, acetylene, ethylene, propylene, butane, cyclohexane, benzene and toluene.

28. The substrate processing system of claim 19, wherein the metal-based precursor gas comprises tungsten hexafluoride, the hydrocarbon precursor gas comprises methane and the carrier gas comprises molecular hydrogen.

29. A substrate processing system for depositing a metal-doped amorphous silicon hardmask film, comprising:
    a processing chamber including a substrate support configured to support a substrate;
    a gas supply system configured to selectively supply process gas to the processing chamber;
    a plasma generator configured to selectively create plasma in or supply plasma to the processing chamber;
    a controller configured to control the gas supply system and the plasma generator and configured to:
    supply a carrier gas to the processing chamber;
    supply a silicon precursor gas to the processing chamber;
    supply a metal-based precursor gas to the processing chamber;
    control the plasma generator to create plasma in or supply plasma to the processing chamber; and
    deposit a metal-doped amorphous silicon hardmask film on the substrate.

30. The substrate processing system of claim 29, wherein the processing chamber comprises a plasma enhanced chemical vapor deposition (PECVD) processing chamber.

31. The substrate processing system of claim 29, wherein the metal-based precursor gas comprises a metal halide precursor gas.

32. The substrate processing system of claim 31, wherein the metal halide precursor gas is selected from a group consisting of $WF_a$, $TiCl_b$, $WCl_c$, $HfCl_d$, and $TaCl_e$, where a, b, c, d and e are integers greater than or equal to one.

33. The substrate processing system of claim 29, wherein the metal-based precursor gas comprises tetrakis(dimethylamino)titanium (TDMAT) precursor gas.

34. The substrate processing system of claim 29, wherein the metal-based precursor gas comprises bis(tert-butylimido)-bis-(dimethylamido)tungsten (BTBMW) precursor gas.

35. The substrate processing system of claim 29, wherein the carrier gas is selected from a group consisting of molecular hydrogen ($H_2$), argon (Ar), molecular nitrogen ($N_2$), helium (He), and/or combinations thereof.

36. The substrate processing system of claim 29, wherein the silicon precursor gas is selected from a group consisting of silane and tetraethylorthosilicate.

* * * * *